United States Patent
Kishimura et al.

(10) Patent No.: US 6,632,582 B2
(45) Date of Patent: Oct. 14, 2003

(54) PATTERN FORMATION MATERIAL AND PATTERN FORMATION METHOD

(75) Inventors: Shinji Kishimura, Itami (JP); Masaru Sasago, Hirakata (JP); Mitsuru Ueda, Yonezawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/838,527

(22) Filed: Apr. 19, 2001

(65) Prior Publication Data

US 2002/0013059 A1 Jan. 31, 2002

(30) Foreign Application Priority Data

Apr. 19, 2000 (JP) ........................................ 2000-117688

(51) Int. Cl.[7] .............................. G03C 1/73; G03C 1/74; G03F 7/039; G03F 7/20; G03F 7/30
(52) U.S. Cl. .................... 430/270.1; 430/313; 430/323; 430/326; 430/331; 430/905; 430/907; 430/908; 430/914; 430/945
(58) Field of Search ............................. 430/270.1, 325, 430/326, 905, 907, 908, 914, 945, 323, 313, 331

(56) References Cited

U.S. PATENT DOCUMENTS 6,270,561 B1 * 8/2001 Nguyen .................... 106/31.85

FOREIGN PATENT DOCUMENTS

| JP | 2000-281790 A | 10/2000 |
| JP | 2000-313744 A | 11/2000 |
| JP | 2000-334881 | * 12/2000 |

OTHER PUBLICATIONS

Crivello et al, *Synthesis and Photopnitiated Catronic Polymerization of Monomers with the Silsesquioxane Core*, Journal of Polymer Science: Part A: Polymer Chemistry, 1997, vol. 35, p. 407–425, 1997.*

Tsuchida et al, *Ethene and Propene Copolymers Containing Silsesquioxane Side Groups*, Macromolecules, 1997, vol. 30, p. 2818–2824, 1997.*

(List continued on next page.)

*Primary Examiner*—Janet Baxter
*Assistant Examiner*—Sin J. Lee
(74) *Attorney, Agent, or Firm*—Nixon Peabody LLP; Donald R. Studebaker (57) ABSTRACT

A pattern formation material contains a base polymer including a siloxane compound represented by Chemical Formula 1:

Chemical Formula 1:

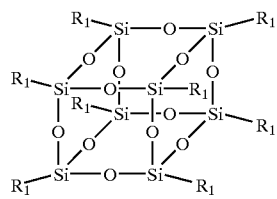

wherein $R_1$ are the same or different compounds selected from the group consisting of an alkyl compound, an ester compound, an ether compound, a sulfone compound, a sulfonyl compound and an aromatic compound.

24 Claims, 3 Drawing Sheets

OTHER PUBLICATIONS

Chemical Abstract (2001: 569651) For Nguyen (6,270,561), 2001.*
Machine-Assisted English Translation For JP 2000-334881 (Provided by Japan Patent Office), 2000.*
Machine –assisted English Translation of JP 2000-313744 Provided by Japan Patent Office Nov. 2000.*
Machine –assisted English Translation of JP 2000-281790 Provided by Japan Patent Office Oct. 2000.*

* cited by examiner

PATTERN FORMATION MATERIAL AND PATTERN FORMATION METHOD

BACKGROUND OF THE INVENTION

The present invention relates to method and material for forming a pattern, and more particularly, it relates to a method for forming a resist pattern, used for forming a semiconductor device or a semiconductor integrated circuit on a semiconductor substrate, by using exposing light of a wavelength of a 1 nm through 30 nm band or a 110 nm through 180 nm band and a pattern formation material used in the method.

Currently, in fabrication of a mass storage semiconductor integrated circuit, such as a 64 Mbit dynamic random access memory (RAM) and a logic device or a system LSI with a 0.25 $\mu$m through 0.15 $\mu$m rule, a resist pattern is formed by using a chemically amplified resist material including a polyhydroxystyrene derivative and an acid generator as principal constituents with KrF excimer laser (of a wavelength of a 248 nm band) used as exposing light.

Moreover, for fabrication of a 256 Mbit DRAM, a 1 Gbit DRAM or a system LSI with a 0.15 $\mu$m through 0.13 $\mu$m rule, a pattern formation method using, as exposing light, ArF excimer laser lasing at a shorter wavelength (of a 193 nm band) than the KrF excimer laser is now under development.

The chemically amplified resist material including a polyhydroxystyrene derivative as a principal constituent has high absorbance against light of a wavelength of a 193 nm band because of an aromatic ring included therein. Therefore, exposing light of a wavelength of a 193 nm band cannot uniformly reach the bottom of a resist film, and hence, a pattern cannot be formed in a good shape. Accordingly, the chemically amplified resist material including a polyhydroxystyrene derivative as a principal constituent cannot be used when the ArF excimer laser is used as the exposing light.

Therefore, a chemically amplified resist material including, as a principal constituent, a polyacrylic acid derivative or a polycycloolefin derivative having no aromatic ring is used when the ArF excimer laser is used as the exposing light.

On the other hand, as exposing light for a pattern formation method capable of coping with high resolution, X rays, an electron beam (EB) and the like are being examined.

When the X rays are used as the exposing light, however, there are a large number of problems in the exposure system and preparation of a mask. Also, when the EB is used as the exposing light, the throughput is disadvantageously low, and hence, the EB is not suitable to mass production. Thus, neither the X rays nor the EB is preferred as the exposing light.

Accordingly, in order to form a resist pattern finer than 0.10 $\mu$m, it is necessary to use exposing light of a wavelength shorter than that of the ArF excimer laser, such as $Xe_2$ laser (of a wavelength of a 172 nm band), $F_2$ laser (of a wavelength of a 157 nm band), $Kr_2$ laser (of a wavelength of a 146 nm band), ArKr laser (of a wavelength of 134 nm band), $Ar_2$ laser (of a wavelength of a 126 nm band) and soft-X rays (of a wavelength of a 13, 11 or 5 nm band). In other words, a resist pattern is required to be formed by using exposing light of a wavelength of a 1 nm through 30 nm band or a 110 nm through 180 nm band.

Therefore, the present inventors have formed resist patterns by conducting pattern exposure using $F_2$ laser (of a wavelength of a 157 nm band) on resist films formed from conventionally known chemically amplified resist materials respectively including a polyhydroxystyrene derivative represented by Chemical Formula A, a polyacrylic acid derivative represented by Chemical Formula B and a polycycloolefin derivative represented by Chemical Formula C.

Chemical Formula A:

Chemical Formula B:

Chemical Formula C:

However, none of the resist patterns can be formed in a rectangular cross-sectional shape, and much scum remains on the semiconductor substrates. Such problems occur not only in using the $F_2$ laser as the exposing light but also in using another light of a wavelength of a 1 nm through 30 nm band or a 110 nm through 180 nm band.

Accordingly, a resist pattern cannot be practically formed by irradiating a resist film formed from a conventional chemically amplified resist material including a polyhydroxystyrene derivative, a polyacrylic acid derivative or a polycycloolefin derivative with light of a wavelength of a 1 nm through 30 nm band or a 110 nm through 180 nm band.

SUMMARY OF THE INVENTION

In consideration of the aforementioned conventional problems, an object of the invention is forming a resist pattern in a good pattern shape with minimally producing scum by using exposing light of a wavelength of a 1 nm through 30 nm band or a 110 nm through 180 nm band.

The present inventors have studied the causes of the conventional problems occurring in using a conventional resist material, such as a resist material including a polyhydroxystyrene derivative as a principal constituent, and have found the following:

First, the resist material including a polyhydroxystyrene derivative has high absorbance against light of a wavelength of a 1 nm through 180 nm band. For example, a resist film with a thickness of 100 nm formed from the resist material has transmittance of 20% at most against a $F_2$ laser beam (of a wavelength of a 157 nm band).

Therefore, various examination has been made on means for improving the transmittance of a resist material against light of a wavelength of a 1 nm through 180 nm band. As a result, the transmittance of a resist film against light of a wavelength of a 1 nm through 180 nm band can be improved when a novel siloxane skeleton having a steric structure is introduced into a base polymer of the resist material as compared with the case where a linear or ladder siloxane skeleton is introduced.

Also, it has been found that when a siloxane skeleton having a steric structure is introduced into the base polymer, the refractoriness of an unexposed portion of the resist film in a developer can be improved.

Moreover, it has been found that when a siloxane skeleton having a steric structure is introduced into the base polymer, the dry etching resistance and the heat resistance of the resist film can be improved.

The present invention was devised on the basis of the aforementioned findings, and specifically, the invention provides the following pattern formation material and pattern formation methods.

The pattern formation material of this invention comprises a base polymer which is a siloxane compound represented by Chemical Formula 1:

Chemical Formula 1:

wherein $R_1$ are the same or different compounds selected from the group consisting of an alkyl compound, an ester compound, an ether compound, a sulfone compound, a sulfonyl compound and an aromatic compound.

In the pattern formation material of this invention, the siloxane compound represented by Chemical Formula 1 has a siloxane skeleton with a steric structure. Therefore, the absorbance against light of a wavelength of a 1 nm through 180 nm band can be lowered as compared with that of a siloxane compound having a linear or ladder siloxane skeleton. Accordingly, the transmittance against light of a wavelength of a 1 nm through 180 nm band of the base polymer can be improved. As a result, when pattern exposure is carried out on a resist film formed from the pattern formation material of this invention by using exposing light of a wavelength of a 1 nm through 180 nm band, a resist pattern can be formed in a rectangular cross-sectional shape.

Furthermore, when a siloxane skeleton with a steric structure is introduced into the base polymer, the refractoriness of an unexposed portion of the resist film in a developer can be improved without changing solubility of an exposed portion in the developer. Therefore, no scum is produced on the substrate as well as the resolution (the contrast between the exposed portion and the unexposed portion) of the resist film can be improved.

Moreover, when a siloxane skeleton with a steric structure is introduced into the base polymer, the dry etching resistance and the heat resistance of the resist film can be also improved.

Preferably, the pattern formation material further comprises an acid generator for generating an acid through irradiation with light, and at least one $R_1$ of Chemical Formula 1 is an alkyl compound represented by Chemical Formula 2:

Chemical Formula 2:

wherein $R_2$ is a protecting group released by an acid.

Thus, a chemically amplified resist film with high resolution, high dry etching resistance and high heat resistance can be formed in a good pattern shape without producing scum.

Preferably, the pattern formation material further comprises an acid generator for generating an acid through irradiation with light, and at least one $R_1$ of Chemical Formula 1 is an alkyl compound represented by Chemical Formula 3:

Chemical Formula 3:

wherein $R_3$ are the same or different protecting groups released by an acid.

Preferably, the pattern formation material further comprises an acid generator for generating an acid through irradiation with light, and at least one $R_1$ of Chemical Formula 1 is an ether compound represented by Chemical Formula 4:

Chemical Formula 4:

wherein $R_4$ is a protecting group released by an acid.

Thus, a chemically amplified resist film with high resolution, high dry etching resistance and high heat resistance can be formed in a good pattern shape without producing scum.

Preferably, the pattern formation material further comprises an acid generator for generating an acid through irradiation with light, and at least one $R_1$ of Chemical Formula 1 is an ether compound represented by Chemical Formula 5:

Chemical Formula 5:

wherein $R_5$ is a protecting group released by an acid.

Thus, a chemically amplified resist film with high resolution, high dry etching resistance and high heat resistance can be formed in a good pattern shape without producing scum.

The first pattern formation method of this invention comprises the steps of forming a resist film by applying, on a substrate, a pattern formation material containing a base polymer which is a siloxane compound represented by Chemical Formula 6:

Chemical Formula 6:

wherein $R_1$ are the same or different compounds selected from the group consisting of an alkyl compound, an ester compound, an ether compound, a sulfone compound, a sulfonyl compound and an aromatic compound; irradiating the resist film with exposing light of a wavelength of a 1 nm through 30 nm band or a 110 nm through 180 nm band for pattern exposure; and forming a resist pattern by developing the resist film after the pattern exposure.

In the first pattern formation method, since the siloxane compound represented by Chemical Formula 6 has a siloxane skeleton with a steric structure, the absorbance against light with a wavelength of a 1 nm through 30 nm band or a 110 nm through 180 nm band can be lowered as compared with that of a siloxane compound with a linear or ladder siloxane skeleton. Therefore, the transmittance against light of a 1 nm through 30 nm band or a 110 nm through 180 nm band of the resist film can be improved, resulting in forming a resist pattern in a rectangular cross-sectional shape.

Furthermore, scum is not produced on the substrate during the formation of the resist pattern and the resolution of the resist film can be improved. Therefore, the resist pattern can be formed in a good pattern shape.

Moreover, the dry etching resistance and the heat resistance of the resist film can be improved.

In the first pattern formation method, the pattern formation material preferably further contains an acid generator for generating an acid through irradiation with light, and at least one $R_1$ of Chemical Formula 6 is preferably an alkyl compound represented by Chemical Formula 7:

Chemical Formula 7:

wherein $R_2$ is a protecting group released by an acid.

Thus, a chemically amplified resist film with high resolution, high dry etching resistance and high heat resistance can be formed in a good pattern shape without producing scum.

In the first pattern formation method, the pattern formation material preferably further contains an acid generator for generating an acid through irradiation with light, and at least one $R_1$ of Chemical Formula 6 is preferably an alkyl compound represented by Chemical Formula 8:

Chemical Formula 8:

wherein $R_3$ are the same or different protecting groups released by an acid.

Thus, a chemically amplified resist film with high resolution, high dry etching resistance and high heat resistance can be formed in a good pattern shape without producing scum.

In the first pattern formation method, the pattern formation material preferably further contains an acid generator for generating an acid through irradiation with light, and at least one $R_1$ of Chemical Formula 6 is preferably an ether compound represented by Chemical Formula 9:

Chemical Formula 9:

wherein $R_4$ is a protecting group released by an acid.

Thus, a chemically amplified resist film with high resolution, high dry etching resistance and high heat resistance can be formed in a good pattern shape without producing scum.

In the first pattern formation method, the pattern formation material preferably further contains an acid generator for generating an acid through irradiation with light, and at least one $R_1$ of Chemical Formula 6 is preferably an ether compound represented by Chemical Formula 10:

Chemical Formula 10:

wherein $R_5$ is a protecting group released by an acid.

Thus, a chemically amplified resist film with high resolution, high dry etching resistance and high heat resistance can be formed in a good pattern shape without producing scum.

The second pattern formation method of this invention comprises the steps of forming an organic film from an organic compound on a substrate; forming a resist film by applying, on the organic film, a pattern formation material containing a base polymer which is a silixoane compound represented by Chemical Formula 11:

Chemical Formula 11:

wherein $R_1$ are the same or different compounds selected from the group consisting of an alkyl compound, an ester compound, an ether compound, a sulfone compound, a sulfonyl compound and an aromatic compound; irradiating the resist film with exposing light of a wavelength of a 1 nm through 30 nm band or a 110 nm through 180 nm band for pattern exposure; forming a resist pattern by developing the resist film after the pattern exposure; and forming an organic film pattern by conducing dry development using oxygen plasma on the organic film with the resist pattern used as a mask.

In the second pattern formation method, since the siloxane compound represented by Chemical Formula 11 has a siloxane skeleton with a steric structure, the absorbance against light of a wavelength of a 1 nm through 30 nm band or a 110 nm through 180 nm band can be lowered as compared with that of a siloxane compound with a linear or ladder siloxane skeleton. Therefore, the transmittance against light of a wavelength of a 1 nm through 30 nm band or a 110 nm through 180 nm band of the resist film can be improved. As a result, a mask pattern including the resist pattern and the organic film pattern can be formed in a rectangular cross-sectional shape.

Furthermore, no scum is produced on the organic film during the formation of the resist pattern as well as the resolution, the dry etching resistance and the heat resistance of the resist film can be improved, resulting in forming a mask pattern with a good pattern shape.

In the second pattern formation method, the pattern formation material preferably further contains an acid generator for generating an acid through irradiation with light, and at least one $R_1$ of Chemical Formula 11 is preferably an alkyl compound represented by Chemical Formula 12:

Chemical Formula 12:

wherein $R_2$ is a protecting group released by an acid.

In the second pattern formation method, the pattern formation material preferably further contains an acid generator for generating an acid through irradiation with light, and at least one $R_1$ of Chemical Formula 11 is preferably an alkyl compound represented by Chemical Formula 13:

Chemical Formula 13:

wherein $R_3$ are the same or different protecting groups released by an acid.

In the second pattern formation method, the pattern formation material preferably further contains an acid generator for generating an acid through irradiation with light, and at least one $R_1$ of Chemical Formula 11 is preferably an ether compound represented by Chemical Formula 14:

Chemical Formula 14:

wherein $R_4$ is a protecting group released by an acid.

In the second pattern formation method, the pattern formation material preferably further contains an acid generator for generating an acid through irradiation with light, and at least one $R_1$ of Chemical Formula 11 is preferably an ether compound represented by Chemical Formula 15:

Chemical Formula 15:

wherein $R_5$ is a protecting group released by an acid.

In the first or second pattern formation method, the exposing light is preferably $F_2$ excimer laser, $Ar_2$ excimer laser or soft-X rays.

DETAILED DESCRIPTION OF THE INVENTION

Embodiment 1

A pattern formation material and a pattern formation method according to Embodiment 1 of the invention will now be described with reference to FIGS. 1A through 1D.

Figure 1A:
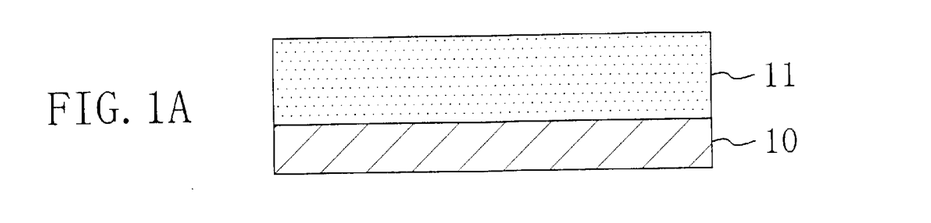
FIGS. 1A, 1B, 1C and 1D are cross-sectional views for showing procedures in a pattern formation method according to any of Embodiments 1 through 8 of the invention.

The resist material of this embodiment is a chemically amplified resist material including a base polymer represented by Chemical Formula 1 in which at least one $R_1$ is an alkyl compound represented by Chemical Formula 2 (wherein $R_2$ is a protecting group released by an acid), and specifically has the following composition:

Base polymer: a polymer represented by Chemical Formula 1 in which at least one $R_1$ is an alkyl compound represented by Chemical Formula 16 below Acid Generator Triphenylsulfonium Triflate Chemical Formula 16:

First, as is shown in FIG. 1A, the resist material having the aforementioned composition is applied on a semiconductor substrate 10 by spin coating, so as to form a resist film 11 with a thickness of 0.2 μm. At this point, since the base polymer is alkali-refractory, the resist film 11 is alkali-refractory.

Figure 1B:
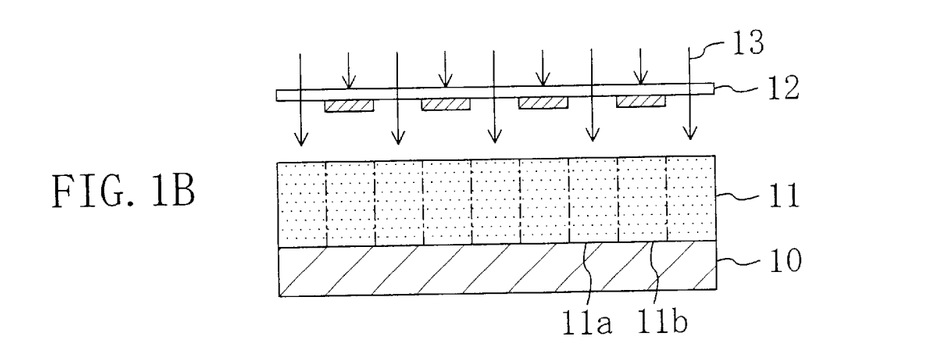

Next, as is shown in FIG. 1B, the resist film 11 is irradiated through a mask 12 with a $F_2$ excimer laser beam 13 (of a wavelength of a 157 nm band) for pattern exposure. Thus, the acid generator is decomposed by the $F_2$ excimer laser beam 13 so as to generate an acid in an exposed portion 11a of the resist film 11 while an unexposed portion 11b of the resist film 11 remains refractory in an alkaline developer.

Figure 1C:
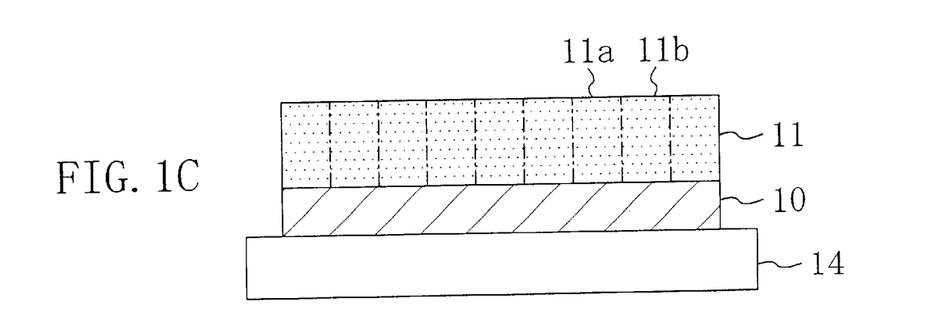

Then, as is shown in FIG. 1C, the semiconductor substrate 10 together with the resist film 11 is heated with a hot plate 14. Thus, the base polymer is decomposed by the acid generated from the acid generator in the exposed portion 11a of the resist film 11, and hence, the exposed portion 11a becomes soluble in an alkaline developer.

Figure 1D:
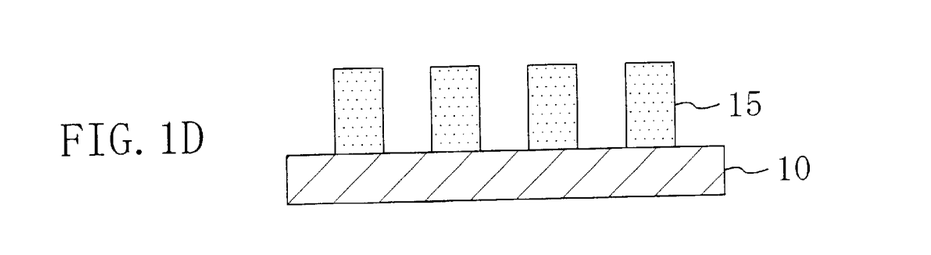

Subsequently, the resist film 11 is developed by using an alkaline developer, such as a tetramethylammonium hydroxide aqueous solution. Thus, the exposed portion 11a of the resist film 11 is dissolved in the developer, so that a resist pattern 15 can be formed from the unexposed portion 11b of the resist film 11 as is shown in FIG. 1D.

Embodiment 2

A pattern formation material and a pattern formation method according to Embodiment 2 of the invention will now be described. Embodiment 2 is different from Embodiment 1 in the resist material alone, and hence, the resist material alone will be herein described.

The resist material of this embodiment is a chemically amplified resist material including a base polymer represented by Chemical Formula 1 in which at least one $R_1$ is an alkyl compound represented by Chemical Formula 3 (wherein $R_3$ are the same or different protecting groups released by an acid), and specifically has the following composition:

Base polymer: a polymer represented by Chemical Formula 1 in which at least one $R_1$ is an alkyl compound represented by Chemical Formula 17 below Acid Generator Triphenylsulfonium Triflate Chemical Formula 17:

Embodiment 3

A pattern formation material and a pattern formation method according to Embodiment 3 of the invention will now be described. Embodiment 3 is different from Embodiment 1 in the resist material alone, and hence, the resist material alone will be herein described.

The resist material of this embodiment is a chemically amplified resist material including a base polymer represented by Chemical Formula 1 in which at least one $R_1$ is an ether compound represented by Chemical Formula 4 (wherein $R_4$ is a protecting group released by an acid), and specifically has the following composition:

Base polymer: a polymer represented by Chemical Formula 1 in which at least one $R_1$ is an ether compound represented by Chemical Formula 18 below Acid Generator cl Triphenylsulfonium Triflate Chemical Formula 18:

Embodiment 4

A pattern formation material and a pattern formation method according to Embodiment 4 of the invention will now be described. Embodiment 4 is different from Embodiment 1 in the resist material alone, and hence, the resist material alone will be herein described.

The resist material of this embodiment is a chemically amplified resist material including a base polymer represented by Chemical Formula 1 in which at least one $R_1$ is an ether compound represented by Chemical Formula 5 (wherein $R_5$ is a protecting group released by an acid), and specifically has the following composition:

Base polymer: a polymer represented by Chemical Formula 1 in which at least one $R_1$ is an ether compound represented by Chemical Formula 19 below Acid Generator Triphenylsulfonium triflate Chemical Formula 19:

Embodiment 5

A pattern formation material and a pattern formation method according to Embodiment 5 of the invention will now be described. Embodiment 5 is different from Embodiment 1 in the resist material alone, and hence, the resist material alone will be herein described.

The resist material of this embodiment is a chemically amplified resist material including a base polymer represented by Chemical Formula 1 in which at least one $R_1$ is an ester compound, and specifically has the following composition:

Base polymer: a polymer represented by Chemical Formula 1 in which at least one $R_1$ is an ester compound represented by Chemical Formula 20 below Acid Generator Triphenylsulfonium Triflate Chemical Formula 20:

Embodiment 6

A pattern formation material and a pattern formation method according to Embodiment 6 of the invention will now be described. Embodiment 6 is different from Embodiment 1 in the resist material alone, and hence, the resist material alone will be herein described.

The resist material of this embodiment is a chemically amplified resist material including a base polymer represented by Chemical Formula 1 in which at least one $R_1$ is a sulfone compound, and specifically has the following composition:

Base polymer: a polymer represented by Chemical Formula 1 in which at least one $R_1$ is a sulfone compound represented by Chemical Formula 21 below Acid Generator Triphenylsulfonium Triflate Chemical Formula 21:

Embodiment 7

A pattern formation material and a pattern formation method according to Embodiment 7 of the invention will now be described. Embodiment 7 is different from Embodiment 1 in the resist material alone, and hence, the resist material alone will be herein described.

The resist material of this embodiment is a chemically amplified resist material including a base polymer represented by Chemical Formula 1 in which at least one $R_1$ is a sulfonyl compound, and specifically has the following composition:

Base polymer: a polymer represented by Chemical Formula 1 in which at least one $R_1$ is a sulfonyl compound represented by Chemical Formula 22 below Acid Generator Triphenylsulfonium Triflate Chemical Formula 22:

Embodiment 8

A pattern formation material and a pattern formation method according to Embodiment 8 of the invention will now be described. Embodiment 8 is different from Embodiment 1 in the resist material alone, and hence, the resist material alone will be herein described.

The resist material of this embodiment is a chemically amplified resist material including a base polymer represented by Chemical Formula 1 in which at least one $R_1$ is an aromatic compound, and specifically has the following composition:

Base polymer: a polymer represented by Chemical Formula 1 in which at least one $R_1$ is an aromatic compound represented by Chemical Formula 23 below Acid Generator Triphenylsulfonium Triflate Chemical Formula 23:

Embodiment 9

A pattern formation material and a pattern formation method according to Embodiment 9 of the invention will now be described with reference to FIGS. 2A through 2C, 3A and 3B.

The resist material of Embodiment 9 is a chemically amplified resist material the same as that of Embodiment 1 and hence is not described in detail.

Figure 2A:
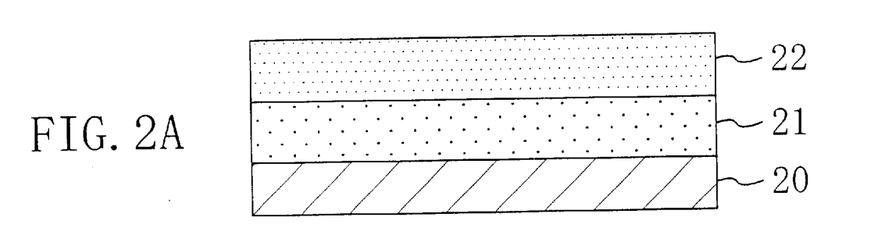
FIGS. 2A, 2B and 2C are cross-sectional views for showing procedures in a pattern formation method according to Embodiment 9 of the invention.

First, as is shown in FIG. 2A, an organic film 21 of an organic compound is formed on a semiconductor substrate 20, and the resist material the same as that of Embodiment 1 is applied on the organic film 21 by spin coating, so as to form a resist film 22 with a thickness of 0.2 μm. At this point, since the base polymer of the resist material is alkali-refractory, the resist film 22 is alkali-refractory. The organic compound may be any of a resist material, an antireflection film and an inexpensive organic material. The organic film 21 has a function to improve dimensional controllability of a mask pattern formed from the organic film 21 or the resist film 22 by, for example, when a film deposited to be etched on the semiconductor substrate 20 has a level difference, relaxing the level difference or by suppressing reflection of exposing light from the film to be etched.

Figure 2B:
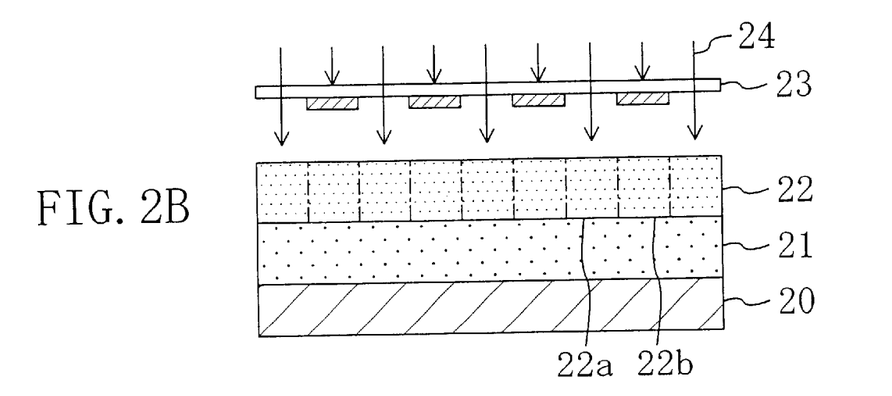

Next, as is shown in FIG. 2B, the resist film 22 is irradiated through a mask 23 with a $F_2$ excimer laser beam 24 (of a wavelength of a 157 nm band) for pattern exposure. Thus, the acid generator is decomposed by the $F_2$ excimer laser beam 24 so as to generate an acid in an exposed portion 22a of the resist film 22 while an unexposed portion 22b of the resist film 22 remains refractory in an alkaline developer.

Figure 2C:
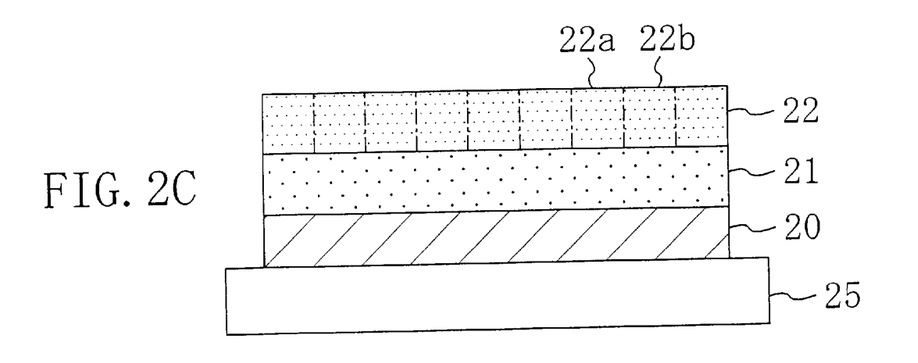

Then, as is shown in FIG. 2C, the semiconductor substrate 20 together with the resist film 22 is heated with a hot plate 25. Thus, the base polymer is decomposed by the acid generated from the acid generator in the exposed portion 22a of the resist film 22, and hence, the exposed portion 22b becomes soluble in an alkaline developer.

Figure 3A:
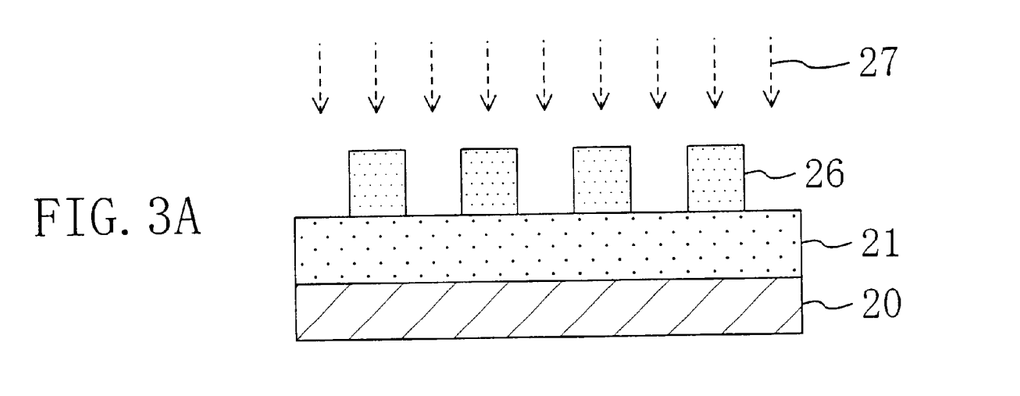
FIGS. 3A and 3B are cross-sectional views for showing other procedures in the pattern formation method of Embodiment 9.

Subsequently, the resist film 22 is developed by using an alkaline developer, such as a tetramethylammonium hydroxide aqueous solution. Thus, the exposed portion 22a of the resist film 22 is dissolved in the developer, so that a resist pattern 26 can be formed from the unexposed portion 22b of the resist film 22 as is shown in FIG. 3A.

Figure 3B:
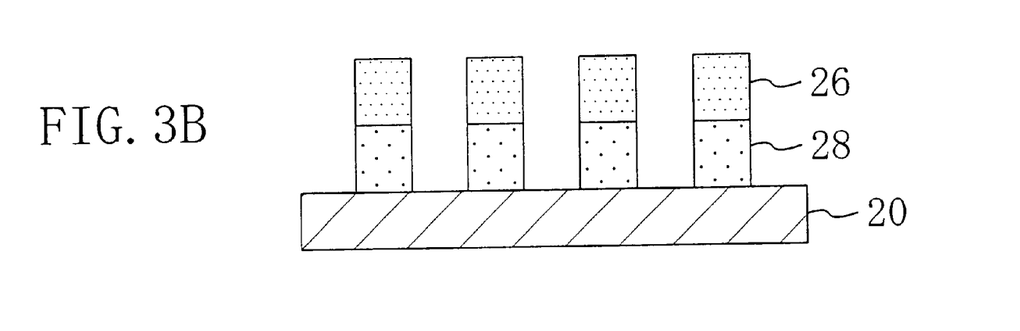

Next, the organic film 21 is subjected to plasma 27 including oxygen with the resist pattern 26 used as a mask. Thus, since silicon included in the resist pattern 26 is bonded to oxygen so as to form silicon oxide and the resist pattern 26 has resistance against oxygen plasma, the shape of the resist pattern 26 is transferred onto the organic film 21. In other words, the organic film 21 is dry developed by using the resist pattern 26 as a mask. Therefore, an organic film pattern 28 is formed from the organic film 21 as is shown in FIG. 3B, resulting in forming a two-layer mask pattern consisting of the resist pattern 26 and the organic film pattern 28.

Although the two-layer mask pattern consisting of the resist pattern 26 and the organic film pattern 28 is formed in Embodiment 9 by using the chemically amplified resist material the same as that of Embodiment 1, the chemically amplified resist material the same as any of Embodiments 2 through 8 may be used instead for forming the two-layer mask pattern.

Although the $F_2$ laser beam is used as the exposing light in any of Embodiments 1 through 9, a $Xe_2$ laser beam, a $Kr_2$ laser beam, an ArKr laser beam, an $Ar_2$ laser beam or soft-X rays may be used instead.

What is claimed is:

1. A pattern formation material comprising:

a base polymer which is a siloxane compound represented by Chemical Formula 1, and an acid generator for generating an acid through irradiation with light,

Chemical Formula 1:

wherein $R_1$ are the same or different compounds selected from the group consisting of an alkyl compound, an ester compound, an ether compound, a sulfone compound, a sulfonyl compound and an aromatic compound;

at least one $R_1$ of Chemical Formula 1 is an alkyl compound represented by

Chemical Formula 2:

wherein $R_2$ is a protecting group released by an acid.

2. A pattern formation material comprising:

a base polymer which is a siloxane compound represented by Chemical Formula 1, and an acid generator for generating an acid through irradiation with light,

Chemical Formula 1:

wherein $R_1$ are the same or different compounds selected from the group consisting of an alkyl compound, an ester compound, an ether compound, a sulfone compound, a sulfonyl compound and an aromatic compound;

at least one $R_1$ of Chemical Formula 1 is an alkyl compound represented by

Chemical Formula 3:

wherein $R_3$ are the same or different protecting groups released by an acid.

3. A pattern formation material comprising:

a base polymer which is a siloxane compound represented by Chemical Formula 1, and an acid generator for generating an acid through irradiation with light,

Chemical Formula 1:

wherein $R_1$ are the same or different compounds selected from the group consisting of an alkyl compound, an ester compound, an ether compound, a sulfone compound, a sulfonyl compound and an aromatic compound;

at least one $R_1$ of Chemical Formula 1 is an alkyl compound represented by

Chemical Formula 4:

wherein $R_4$ is a protecting group released by an acid.

4. A pattern formation material comprising:
a base polymer which is a siloxane compound represented by Chemical Formula 1, and
an acid generator for generating an acid through irradiation with light,

Chemical Formula 1:

wherein $R_1$ are the same or different compounds selected from the group consisting of an alkyl compound, an ester compound, an ether compound, a sulfone compound, a sulfonyl compound and an aromatic compound;

at least one $R_1$ of Chemical Formula 1 is an alkyl compound represented by

Chemical Formula 5:

wherein $R_5$ is a protecting group released by an acid.

5. A pattern formation method comprising the steps of:
forming a resist film by applying, on a substrate, a pattern formation material containing a base polymer which is a siloxane compound represented by Chemical Formula 6:

Chemical Formula 6:

wherein $R_1$ are the same or different compounds selected from the group consisting of an alkyl compound, an ester compound, an ether compound, a sulfone compound, a sulfonyl compound and an aromatic compound;

irradiating said resist film with exposing light of a wavelength of a 1 nm through 30 nm band or a 110 nm through 180 nm band for pattern exposure; and forming a resist pattern by developing said resist film after the pattern exposure.

6. The pattern formation method of claim 5,
wherein said pattern formation material further contains an acid generator for generating an acid through irradiation with light, and
at least one $R_1$ of Chemical Formula 6 is an alkyl compound represented by Chemical Formula 7:

Chemical Formula 7:

wherein $R_2$ is a protecting group released by an acid.

7. The pattern formation method of claim 5,
wherein said pattern formation material further contains an acid generator for generating an acid through irradiation with light, and
at least one $R_1$ of Chemical Formula 6 is an alkyl compound represented by Chemical Formula 8:

Chemical Formula 8:

wherein $R_3$ are the same or different protecting groups released by an acid.

8. The pattern formation method of claim 5,
wherein said pattern formation material further contains an acid generator for generating an acid through irradiation with light, and at least one R₁ of Chemical Formula 6 is an ether compound represented by Chemical Formula 9:

Chemical Formula 9:

wherein $R_4$ is a protecting group released by an acid.

9. The pattern formation method of claim 5,
wherein said pattern formation material further contains an acid generator for generating an acid through irradiation with light, and
at least one R₁ of Chemical Formula 6 is an ether compound represented by Chemical Formula 10:

Chemical Formula 10:

wherein $R_5$ is a protecting group released by an acid.

10. A pattern formation method of claim 5,
wherein said exposing light is $Xe_2$ laser, $F_2$ laser, $Kr_2$ laser, ArKr laser, $Ar_2$ laser or soft-X rays.

11. The pattern formation method of claim 5,
wherein said pattern formation material further contains an acid generator for generating an acid through irradiation with light, and
at least on R₁ of Chemical, Formula 6 is an ester compound represented by Chemical Formula 20:

Chemical Formula 20:

12. The pattern formation method of claim 5,
wherein said pattern formation material further contains an acid generator for generating an acid through irradiation with light, and
at least on R₁ of Chemical Formula 6 is a sulfone compound represented by Chemical Formula 21:

Chemical Formula 21:

13. The pattern formation method of claim 6,
wherein said pattern formation material further contains an acid generator for generating an acid through irradiation with light, and at least on R₁ of Chemical Formula 6 is a sulfonyl compound represented by Chemical Formula 22:

Chemical Formula 22:

14. The pattern formation method of claim 5,
wherein said pattern formation material further contains an acid generator for generating an acid through irradiation with light, and
at least on R₁ of Chemical Formula 6 is an aromatic compound represented by Chemical Formula 23:

Chemical Formula 23:

15. A pattern formation method comprising the steps of:
forming an organic film from an organic compound on a substrate;
forming a resist film by applying, on a substrate, a pattern formation material containing a base polymer which is a silioxane compound represented by Chemical Formula 11:

Chemical Formula 11:

wherein R₁ are the same or different compounds selected from the group consisting of an alkyl compound, an ester compound, an ether compound, a sulfone compound, a sulfonyl compound and an aromatic compound;
irradiating said resist film with exposing light of a wavelength of a 1 nm through 30 nm band or a 110 nm through 180 nm band for pattern exposure;
forming a resist pattern by developing said resist film after the pattern exposure; and
forming an organic film pattern by conducting dry development using oxygen plasma on said organic film with said resist pattern used as a mask.

16. The pattern formation method of claim 15,
wherein said pattern formation material further contains an acid generator for generating an acid through irradiation with light, and at least one $R_1$ of Chemical Formula 11 is an alkyl compound represented by Chemical Formula 12:

Chemical Formula 12:

$$-\underset{H}{\overset{H}{C}}-\underset{H}{\overset{H}{C}}-\underset{CH_3}{\overset{CH_3}{Si}}-O-\underset{H}{\overset{H}{C}}-\underset{H}{\overset{H}{C}}-\underset{CF_3}{\overset{CF_3}{C}}-O-R_2$$

wherein $R_2$ is a protecting group released by an acid.

17. The pattern formation method of claim 15,
wherein said pattern formation material further contains an acid generator for generating an acid through irradiation with light, and
at least one $R_1$ of Chemical Formula 11 is an alkyl compound represented by Chemical Formula 13:

Chemical Formula 13:

[structure with Si center bonded to two branches each containing —C—C—C—O—R₃ with CF₃ groups]

wherein $R_3$ are the same or different protecting groups released by an acid.

18. The pattern formation method of claim 15,
wherein said pattern formation material further contains an acid generator for generating an acid through irradiation with light, and
at least one $R_1$ of Chemical Formula 11 is an ether compound represented by Chemical Formula 14:

Chemical Formula 14:

$$-O-\underset{CH_3}{\overset{CH_3}{Si}}-\underset{H}{\overset{H}{C}}-\underset{H}{\overset{H}{C}}-\underset{CF_3}{\overset{CF_3}{C}}-O-R_4$$

wherein $R_4$ is a protecting group released by an acid.

19. The pattern formation method of claim 15,
wherein said pattern formation material further contains an acid generator for generating an acid through irradiation with light, and
at least one $R_1$ of Chemical Formula 11 is an ether compound represented by Chemical Formula 15:

Chemical Formula 15:

$$-O-\underset{CH_3}{\overset{CH_3}{Si}}-\underset{H}{\overset{H}{C}}-\underset{H}{\overset{H}{C}}-\underset{H}{\overset{H}{C}}-\underset{CF_3}{\overset{CF_3}{C}}-O-R_5$$

wherein $R_5$ is a protecting group released by an acid.

20. A pattern formation method of claim 15, wherein said exposing light is $Xe_2$ laser, $F_2$ laser, $Kr_2$ laser, ArKr laser, $Ar_2$ laser or soft-X rays.

21. The pattern formation method of claim 15,
wherein said pattern formation material further contains an acid generator for generating an acid through irradiation with light, and
at least on $R_1$ of Chemical Formula 11 is an ester compound represented by Chemical Formula 20:

Chemical Formula 20:

$$-\underset{}{\overset{}{C}}=O$$
$$|$$
$$O$$
$$|$$
$$CH_3-\underset{CH_3}{\overset{CH_3}{C}}-CH_3.$$

22. The pattern formation method of claim 15,
wherein said pattern formation material further contains an acid generator for generating an acid through irradiation with light, and
at least on $R_1$ of Chemical Formula 11 is a sulfone compound represented by Chemical Formula 21:

Chemical Formula 21:

$$-\underset{O}{\overset{O}{\underset{\|}{\overset{\|}{S}}}}-F.$$

23. The pattern formation method of claim 15,
wherein said pattern formation material further contains an acid generator for generating an acid through irradiation with light, and
at least on $R_1$ of Chemical Formula 11 is a sulfonyl compound represented by Chemical Formula 22:

Chemical Formula 22:

$$-\underset{O}{\overset{O}{\underset{\|}{\overset{\|}{S}}}}-O-CH_3.$$

24. The pattern formation method of claim 15,
wherein said pattern formation material further contains an acid generator for generating an acid through irradiation with light, and
at least on $R_1$ of Chemical Formula 11 is a aromatic compound represented by Chemical Formula 23:

Chemical Formula 23:

[para-substituted benzene ring with CH₃ on top and O—C(=O)—C(CH₃)₃ on bottom]

* * * * *

UNITED STATES PATENT AND TRADEMARK OFFICE
CERTIFICATE OF CORRECTION

PATENT NO. : 6,632,582 B2
APPLICATION NO. : 09/838527
DATED : October 14, 2003
INVENTOR(S) : Shinji Kishimura et al.

It is certified that error appears in the above-identified patent and that said Letters Patent is hereby corrected as shown below:

Section [75], "Inventors", replace "Itami" with -- Hyogo --;

Section [75], "Inventors", replace "Hirakata" with -- Osaka --;

Section [75], "Inventors", replace "Yonezawa" with -- Yamagata --;

Column 17, line 35, change "Chemical, Formula 6" to -- Chemical Formula 6 --;

Column 17, line 64, change "claim 6," to -- claim 5, --;

Signed and Sealed this

Twenty-first Day of November, 2006

JON W. DUDAS
*Director of the United States Patent and Trademark Office*